United States Patent
Shibata et al.

(10) Patent No.: US 6,649,288 B2
(45) Date of Patent: Nov. 18, 2003

(54) NITRIDE FILM

(75) Inventors: Tomohiko Shibata, Kasugai (JP);
Yukinori Nakamura, Nagoya (JP);
Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/981,295

(22) Filed: Oct. 16, 2001

(65) Prior Publication Data

US 2002/0081463 A1 Jun. 27, 2002

(30) Foreign Application Priority Data

Oct. 18, 2000 (JP) ...................................... 2000-317684
Oct. 12, 2001 (JP) ...................................... 2001-315172

(51) Int. Cl.$^7$ ............................................... B32B 9/04
(52) U.S. Cl. ...................................................... 428/698
(58) Field of Search .......................................... 428/698

(56) References Cited

U.S. PATENT DOCUMENTS

| | | | |
|---|---|---|---|
| 5,729,029 A | * | 3/1998 | Rudaz ........................ 257/13 |
| 6,326,638 B1 | * | 12/2001 | Kamiyama et al. ........... 257/13 |
| 6,429,465 B1 | * | 8/2002 | Yagi et al. .................. 257/103 |
| 2002/0020850 A1 | | 2/2002 | Shibata et al. |

FOREIGN PATENT DOCUMENTS

EP 0497350 A 8/1992

OTHER PUBLICATIONS

U.S. copending application 10/102,545, Tomohiko Shibata et al., filed Mar. 20, 2002.
U.S. copending application 10/163,256, Tomohiko Shibata et al., filed Jun. 5, 2002.
U.S. copending application 10/074,589, Tomohiko Shibata et al., filed Feb. 13, 2002.
"Biaxial strain in $Al_xGa_{1-x}N$/GaN layers deposited on 6H–SiC," Perry et al., *Thin Solid Films*, Elsevier (pub.), 324(1998) pp. 107–114, No Month.
"Structural characterization of $Al_{1-x}In_xN$ lattice–matched to GaN," Kariya et al., *Journal of Crystal Growth*, Elsevier (pub.), 209(2000) pp. 419–423, No Month.
"Biaxial strain in $Al_xGa_{1-x}N$/GaN layers deposited on 6H–SiC,", Perry et al., *Thin Solid Films*, Elsevier (pub.), 324(1998) pp. 107–114.
"Structural characterization of $Al_{1-x}In_xN$ lattice–matched to GaN," Kariya et al., *Journal of Crystal Growth*, Elsevier (pub.), 209(2000) pp. 419–423.

* cited by examiner

*Primary Examiner*—Deborah Jones
*Assistant Examiner*—G. Blackwell-Rudasill
(74) *Attorney, Agent, or Firm*—Burr & Brown

(57) ABSTRACT

A Group III nitride film is directly grown on a crystalline substrate along the C-axis of the substrate, and includes at least Al. The Group III nitride film has a hexagonal crystal system, and the lattice constant "c" of the c-axis of the Group III nitride film and the lattice constant "a" of the crystal face perpendicular to the main surface of the substrate satisfies the relation of "C>2.636a-3.232".

10 Claims, 1 Drawing Sheet

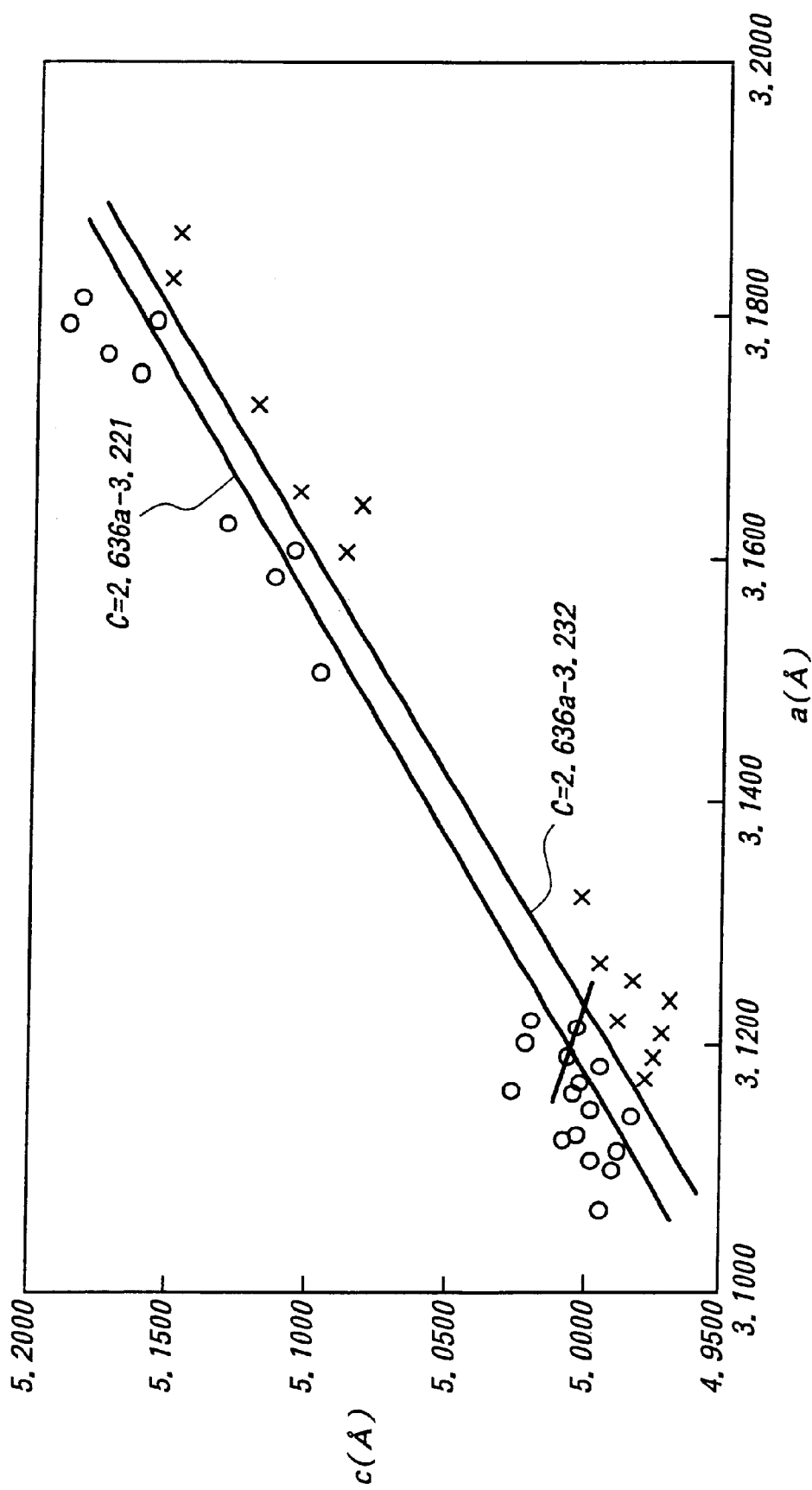

NITRIDE FILM

BACKGROUND OF THE INVENTION (1) Field of the invention:

This invention relates to a III nitride film, particularly to an Al-including III nitride film which is suitable for a light-emitting diode or a high speed IC chip.

(2) Related Art Statement:

Al-including III nitride films are used as semiconductor films for light-emitting diodes, and recently get attention as semiconductor films for high speed IC chips of cellular phones.

Conventionally, such an Al-including film is fabricated by a MOCVD method in which trimethyl aluminum (TMA) and triethyl aluminum (TEA) are employed as an Al supply source, and ammonia ($NH_3$) is employed as a nitrogen supply source.

In this case, a substrate on which the III nitride film is formed is set on a susceptor installed in a reactor and is heated to around 1000° C. by a heater provided in or out of the reactor. Then, the Al supply source, the nitrogen supply source and another supply source including another additive element, with given carrier gases, are introduced into the reactor and supplied onto the substrate.

Just then, the supply sources thermochemically react on the substrate, and the thus decomposed constituent elements chemically react to deposit a desired Al-including III nitride film on the substrate.

However, when the Al-including III nitride film is formed directly on a single crystal substrate made of C-faced sapphire single crystal, C-faced SiC single crystal or the like or an epitaxial substrate constructed of the same single crystal and an underfilm made of III nitride, some cracks may be created in the film, irrespective of the composition, depending on the film-forming condition and the film-forming apparatus condition such as the reactor configuration and size.

Therefore, the yield ratio of elements constructed of such single crystal substrates or epitaxial substrates and the Al-including III nitride films formed on the substrates is degraded.

SUMMARY OF THE INVENTION

It is an object of the present invention to provide an Al-including III nitride film without cracks when it is formed directly on a single crystal substrate or an epitaxial substrate.

In order to achieve the above object, this invention relates to a III nitride film including at least Al element and having hexagonal crystal system which is directly grown on a crystalline substrate along the C-axis, the lattice constant "c" of the main axis of the III nitride film and the lattice constant "a" of the crystal face perpendicular to the main surface of the substrate satisfying the relation of "c>2.636a-3.232". Here, "along the C-axis" includes subtle tilt of the C-axis originated form deviation of growth conditions, subtle off-angle value of crystalline substrate and so forth.

In a preferred embodiment of the present invention, the lattice constant "c" and the lattice constant "a" satisfy the relation of "c>2.636a-3.221". In this case, even though the III nitride film is thermally shocked, no cracks are created in the film.

The inventors intensely studied to obtain an Al-including III nitride film without cracks when the III nitride film is formed directly on a crystalline substrate. Since the cracks in the III nitride film occurred, irrespective of the composition, depending on the film-forming condition and the film-forming apparatus condition, the inventors intensely investigated the physical properties of the film and substrate which influence the creation of cracks.

As a result, the inventors discovered that the crack creation in the III nitride film directly formed on the crystalline substrate relates to the sizes of lattice constants of the crystal lattice of the III nitride film. That is, in the hexagonal crystal lattice of the III nitride film, if the lattice constant "c" of the main axis and the lattice constant "a" of the crystal face perpendicular to the main axis satisfy the above relation, the crack creation can be inhibited even though the III nitride film is formed directly on the crystalline substrate. This invention results from the above enormous research and development.

FIG. 1 is a graph showing the correlation between the lattice constants and the crack creation in a III nitride film having a composition of $Al_xGa_yIn_zN$ ($x+y+z=1$, $x>0$). As is apparent from FIG. 1, if the relation of "c>2.636a-3.232" is satisfied, cracks are not created in the film. On the other hand, if the relation is not satisfied, some cracks are created in the film.

Herein, in FIG. 1, ○ plots designate that cracks are not created and x plots designate that cracks are created.

BRIEF DESCRIPTION OF THE DRAWINGS

For better understanding of the present invention, reference is made to the attached drawings, wherein:

FIG. 1 is a graph showing the correlation between the lattice constants and the crack creation in a III nitride film having a composition of $Al_xGa_yIn_zN$ ($x+y+z=1$, $x>0$).

DESCRIPTION OF THE PREFERRED EMBODIMENTS

This invention will be described in detail, hereinafter.

It is required in the present invention that, in the hexagonal crystal lattice of a c-axis grown Al-including III nitride film, the lattice constant "c" of the main axis(c-axis) of the III nitride film and the lattice constant "a" of the crystal face perpendicular to the main axis of the substrate satisfy the relation of "c>2.636a-3.232", preferably "c>2.636a-3.221".

The above requirement can be realized by controlling appropriately the temperature, the pressure and the supply gas source ratio, and controlling appropriately the evacuating rate and the flow direction of the supply gas on a crystalline substrate on which the III nitride film is to be formed. These conditions are appropriately selected and optimized, depending on the material, the composition and the thickness of the III nitride film to be formed.

Moreover, the above requirements can be satisfied by forming an underfilm between the crystalline substrate and the III nitride film and optimizing the composition of the underfilm. For example, a high quality single crystalline III nitride film having a large Al content is formed as the underfilm on a C-faced sapphire substrate, and the III nitride film is formed on the single crystalline nitride film.

The III nitride film is required to include at least Al element. In the case that the III nitride film is used as a semiconductor film for a light-emitting element, it is desired that the film has the composition of $Al_xGa_yIn_zN$ ($x+y+z=1$, $x>0$). Moreover, the III nitride film may contain an additive element such as B, Si, Mg.

Moreover, the III nitride film has preferably larger Al content. Concretely, the film preferably has the composition of $Al_xGa_yIn_zN$ (x+y+z=1, x>0.5), particularly $Al_xGa_yIn_zN$ (x+y+z=1, x>0.9).

Such III nitride films can be employed for light-emitting diodes and high speed IC chips. In this case, the III nitride films are formed directly on their respective crystalline substrates, so some cracks are created in the films, depending on their film-forming conditions and film-forming apparatus conditions.

Therefore, if the nitride films satisfy the above lattice constant relation according to the present invention, cracks are almost never created in the films. As a result, the yield ratio of such light-emitting diodes and high speed IC chips can be developed.

It is desired that the thickness of the III nitride film is set to 1 μm or more, particularly 2 μm or more. Conventionally, if the thickness of a III nitride film as formed directly on a crystalline substrate is larger than 1 μm, a large amount of cracks may be created in the film. However, if the thicker film satisfies the above lattice constant relation, the crack creation can be inhibited effectively. Therefore, according to the present invention, a thicker III nitride film can be provided.

The crystalline substrate may be made of any single crystal. Concretely, the following are examples, oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as $Zr_2B_2$.

Moreover, an epitaxial substrate constructed of a single crystal substrate made of the above-mentioned single crystal and an underfilm formed on the substrate may be employed. For facilitating the epitaxial growth of the Al-including III nitride film of the present invention, the underfilm also is preferably made of an Al-including III nitride film.

Then, in the case that the Al-including III nitride film of the present invention has the composition of $Al_xGa_yIn_zN$ (x+y+z=1, x>0), for the facilitation of the epitaxial growth, it is desired that the underfilm also has the composition of $Al_aGa_bIn_cN$ (a+b+c=1, a>x).

EXAMPLES:

Example

This invention will be concretely described, hereinafter.

A C-faced sapphire single crystal substrate was employed, and then, set and attracted on a susceptor installed in a quartz reactor.

Then, trimethyl aluminum (TMA), trimethyl gallium (TMG) and trimethyl indium (TMI) were employed as an Al supply source, a Ga supply source and an In supply source, respectively. Moreover, ammonia gas was employed as a nitrogen supply source. Since those supply sources except ammonia gas are liquid or solid at room temperature, they are vaporized through bubbling operation.

Then, the ammonia gas which corresponds to V element supply source and the TMA, the TMG and the TMI which correspond to III element supply source were introduced into the reactor at a (V/III) flow ratio of 1000 or below, and supplied onto the substrate. Then, the substrate was heated to 1150° C., and thus, an AlGaInN single crystalline film was fabricated as an underfilm in a thickness of 1 μm. When the crystallinity of the AlGaInN underfilm was investigated by X-ray analysis, it was confirmed that the full width at half maximum of an X-ray rocking curve was 90 seconds or below. Accordingly, the underfilm had a high crystallinity.

Thereafter, the substrate having the AlGaInN underfilm was heated to 1200° C., and subsequently, cooled down to a given temperature lower than the underfilm-forming temperature of 1150° C. Then, the same supply sources were supplied at a higher (V/III) flow ratio than the underfilm-forming flow ratio of 1000 or below to fabricate plural AlGaInN films. These results include underfilm data.

The lattice constants of the AlGaInN films were measured by X-ray diffraction, and their respective lattice constants "c" and "a" were plotted as ○ plots. These date include the underfilm data. And, cracks were not created in all of the AlGaInN films.

Comparative Example

The (V/III) flow ratio and the substrate temperature being controlled appropriately, an AlGaInN underfilm having a smaller Al content than an AlGaInN film to be formed was formed on a C-faced sapphire substrate. Then, the AlGaInN film was formed on the underfilm. A film-forming process like this was repeated twice, and two kinds of AlGaInN films were fabricated.

The lattice constants "c" and "a" of the AlGaInN films were measured by the same manner as in Example, and plotted as X plots. Many cracks were created in the AlGaInN films.

As is apparent from FIG. 1 and the above-mentioned crack observation, in the AlGaInN films satisfying the relation of "c>2.636a-3.232" for the lattice constant "c" and "a", no cracks were created. On the other hand, in the AlGaInN films not satisfying the above relation for the lattice constant "c" and "a", many cracks were created.

Moreover, the obtained films were exposed to a high temperature of 1000° C. in order to do thermal shock test. After the test, the AlGaInN films satisfying the relation of "c>2.636a-3.221" for the lattice constants, "c" and "a", did not have crack formation. However, in some films satisfying the relation of "2.636a-3.221≧c>2.636a-3.232", cracks were generated.

Although the present invention was described in detail with reference to the above examples, this invention is not limited to the above disclosure and variations and modifications may be made without departing from the spirit and scope of the present invention.

As explained above, according to the present invention, if a III nitride film including at least Al is formed directly on a crystalline substrate, such as single crystal substrate made of C-faced sapphire single crystal or C-faced SiC single crystal, or an epitaxial substrate, no cracks are created in the III nitride film.

What is claimed is:

1. A III nitride film including at least Al and having a hexagonal crystal system which is directly grown on a crystalline substrate along the C-axis, the lattice constant "c" of the c-axis of said film and the lattice constant "a" of the crystal face perpendicular to the main surface of said substrate satisfying the relation of "c>2.636a-3.232".

2. A III nitride film as defined in claim 1, wherein the lattice constants "c" and "a" satisfies the relation of "c>2.636a-3.221".

3. A III nitride film as defined in claim 1, wherein the III nitride film is an $Al_xGa_yIn_zN$ film (x+y+z=1, x>0.5).

4. A III nitride film as defined in claim 3, wherein the III nitride film is an $Al_xGa_yIn_zN$ film (x+y+z=1, x>0.9).

5. A III nitride film as defined in claim 1, wherein a thickness of the III nitride film is at least 1 μm.

6. A III nitride film as defined in claim 1, wherein the crystalline substrate is made of a single crystal substrate.

7. A III nitride film as defined in claim 6, wherein the single crystal substrate is one of a C-faced sapphire substrate and a C-faced SiC substrate.

8. A III nitride film including at least Al and having a hexagonal crystal system which is directly grown on a crystalline substrate along the C-axis, the lattice constant "c" of the c-axis of said film and the lattice constant "a" of the crystal face perpendicular to the main surface of said substrate satisfying the relation of "c>2.636a-3.232", wherein the crystalline substrate comprises an epitaxial substrate which is constructed of a given base material and a III nitride underfilm including at least Al.

9. A III nitride film as defined in claim 8, wherein the III nitride film is an $Al_xGa_yIn_zN$ film (x+y+z=1, x>0), and the III nitride underfilm is an $Al_aGa_bIn_cN$ film (a+b+c=1, a>x).

10. A III nitride film as defined in claim 9, wherein the crystallinity of the III nitride underfilm is set to a full width at half maximum of an X-ray rocking curve of 90 seconds or below.

* * * * *